United States Patent
Wu et al.

(10) Patent No.: US 8,420,545 B2
(45) Date of Patent: Apr. 16, 2013

(54) PLASMA ETCHING METHOD AND PLASMA ETCHING APPARATUS FOR PREPARING HIGH-ASPECT-RATIO STRUCTURES

(75) Inventors: Chang Ming Wu, New Taipei (TW); Yi Nan Chen, Taipei (TW); Hsien Wen Liu, Luzhu Township (TW)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 50 days.

(21) Appl. No.: 13/113,245

(22) Filed: May 23, 2011

(65) Prior Publication Data
US 2012/0302031 A1    Nov. 29, 2012

(51) Int. Cl.
*H01L 21/302* (2006.01)
(52) U.S. Cl.
USPC .............. 438/710; 438/396; 257/E21.008
(58) Field of Classification Search .......... 438/707; 257/E21.014, E21.536
See application file for complete search history.

(56) References Cited

U.S. PATENT DOCUMENTS

2008/0188082 A1* 8/2008 Chi et al. ............ 438/700
2010/0273332 A1* 10/2010 Edelberg ............ 438/710

\* cited by examiner

*Primary Examiner* — Cheung Lee
(74) *Attorney, Agent, or Firm* — Novak Druce Connolly Bove + Quigg LLP

(57) ABSTRACT

The present invention relates to a plasma etching method and apparatus for preparing high-aspect-ratio structures. The method includes the steps of placing the substrate into a plasma etching apparatus, wherein the plasma etching apparatus includes an upper electrode plate and a lower electrode plate; continuously supplying an upper source RF power and a DC power to the upper electrode plate; and discontinuously supplying a bias RF power to the lower electrode plate. When the bias RF power is switched to the off state, a large amount of secondary electrons pass through the bulk plasma and reach the substrate to neutralize the positive ions during the duration time of the off state ($T_{off}$).

11 Claims, 15 Drawing Sheets

PLASMA ETCHING METHOD AND PLASMA ETCHING APPARATUS FOR PREPARING HIGH-ASPECT-RATIO STRUCTURES

TECHNICAL FIELD

The present invention relates to a plasma etching method and apparatus for preparing high-aspect-ratio structures, and more particularly, to a plasma etching method and apparatus for preparing high-aspect-ratio structures by discontinuously supplying a bias RF power.

BACKGROUND

FIGS. 1 to 3 show the etching steps of a conventional method for preparing a stacked capacitor. As shown in FIG. 1, a substrate 12 is provided. The substrate 12 includes four gate structures 14, a bit-line contact plug 16, two capacitor contact plugs 18, 18a and a dielectric layer 20. A carbon hard mask 10 is applied on the substrate 12. The carbon hard mask 10 has a pattern 101 to expose part of the substrate 12.

As shown in FIG. 2, the substrate 12 with the carbon hard mask 10 is placed in a plasma etching apparatus 2. The plasma etching apparatus 2 comprises a container 21, an upper electrode plate 23, a lower electrode plate 25, a gas source 26, a gas exhaust unit 27, an upper source RF power supply 28, an upper source RF power supply controller 281, a DC power supply 29, a DC power supply controller 291, a bias RF power supply 30, a bias RF power supply controller 301, a lower source RF power supply 31 and a lower source RF power supply controller 311.

The container 21 defines a processing chamber 22 and is electrically grounded. The upper electrode plate 23 is disposed in the processing chamber 22. The lower electrode plate 25 is disposed in the processing chamber 22 and includes a chuck 24 for holding the substrate 12. The gas source 26 is connected to the processing chamber 22 for introducing a processing gas into the processing chamber 22. Usually, the gas source 26 comprises an etch gas source 261, a deposition gas source 262 and a gas controller 263. The etch gas source 261 supplies an etch gas to the processing chamber 22 and the deposition gas source 262 supplies a deposition gas to the processing chamber 22 through the gas controller 263. The gas exhaust unit 27 is used for removing the gas from the processing chamber 22 so as to control the pressure in the processing chamber 22.

The upper source RF power supply 28 is controlled by the upper source RF power supply controller 281, and is electrically connected to the upper electrode plate 23 for continuously supplying an upper source RF power to the upper electrode plate 23 during a plasma etching process. The DC power supply 29 is controlled by the DC power supply controller 291, and is electrically connected to the upper electrode plate 23 for continuously supplying a DC power to the upper electrode plate 23 during the plasma etching process.

The bias RF power supply 30 is controlled by the bias RF power supply controller 301, and is electrically connected to the lower electrode plate 25 for continuously supplying a bias RF power to the lower electrode plate 25 so as to generate a plasma in the processing chamber 22 to etch the substrate 12. The lower source RF power supply 31 is controlled by the lower source RF power supply controller 311, and is electrically connected to the lower electrode plate 25 for continuously supplying a lower source RF power to the lower electrode plate 25.

As shown in FIG. 3, during the etching process, the dielectric layer 20 of the substrate 12 is etched to form two high-aspect-ratio trenches 19, 19a. The trench 19 exposes the capacitor contact plug 18 and is considered as a qualified trench. The trench 19a has a twisted profile that does not expose the capacitor contact plug 18a, and thus is considered a non-qualified trench. In the subsequent process, the conductive layer deposited in the trench 19a cannot connect to the capacitor contact plug 18a, making an open circuit. Alternatively, the trench 19a may expose another capacitor contact plug, allowing the conductive layer deposited in the trench 19a to connect to the unexpected capacitor contact plug, making a short circuit.

The formation of the trench 19a is described as follows. During the etching process, most of the electrons 21b are distributed around the carbon hard mask 10, and a large amount of the positive ions 21a penetrate deeply into the trench 19a. Because there are too many positive ions 21a on the bottom of the trench 19a, the trajectories of the following positive ions are bent, causing the twisting profile of the trench 19a. In addition, the unbalanced concentration between the etch gas and the deposition gas also influences the profile of the trench 19a.

In order to improve the above-mentioned problem, the DC power supply 29 is used to continuously supply a DC power to the upper electrode plate 23 to induce the secondary electron emission. The secondary electrons are expected to pass through the bulk plasma and sheath, then enter the trench 19a to neutralize the positive ions 21a. However, in fact, the secondary electrons need super high energy to pass through the bulk plasma and sheath, and less than 6% of the secondary electrons are able to reach the substrate 12. Thus, the DC power superposition is not able to eliminate the twisting profile of the trench 19a.

SUMMARY

The present invention is directed to a plasma etching method for preparing high-aspect-ratio structures, comprising the steps of: forming a mask on a substrate, wherein the mask has a pattern; placing the substrate with the mask into a plasma etching apparatus, wherein the plasma etching apparatus comprises a processing chamber, an upper electrode plate and a lower electrode plate, the upper electrode plate and the lower electrode plate are disposed in the processing chamber, and the lower electrode plate includes a chuck for holding the substrate; introducing a processing gas into the processing chamber; continuously supplying an upper source RF power and a DC power to the upper electrode plate during the plasma etching process; and supplying a bias RF power to the lower electrode plate so as to generate a plasma in the processing chamber to etch the substrate according to the pattern of the mask, wherein the bias RF power is supplied discontinuously during the plasma etching process.

In the present invention, when the bias RF power is switched to the off state, the sheath disappears. Therefore, a large amount of secondary electrons pass through the bulk plasma and reach the substrate to neutralize to the positive ions during the duration of the off state ($T_{off}$). As a result, the high-aspect-ratio structures are straight.

The present invention is also directed to a plasma etching apparatus, comprising a container, an upper electrode plate, a lower electrode plate, a gas source, an upper source RF power supply, a DC power supply, a bias RF power supply and a pulsing module. The container defines a processing chamber. The upper electrode plate is disposed in the processing chamber. The lower electrode plate is disposed in the processing chamber and includes a chuck for holding a substrate. The gas source is connected to the processing chamber for introducing a processing gas into the processing chamber. The upper source RF power supply is electrically connected to the upper electrode plate for continuously supplying an upper source RF power to the upper electrode plate during a plasma etching process. The DC power supply is electrically connected to the upper electrode plate for continuously supplying a DC power to the upper electrode plate during the plasma etching process. The bias RF power supply is electrically connected to the lower electrode plate for supplying a bias RF power to the lower electrode plate so as to generate a plasma in the processing chamber to etch the substrate. The pulsing module is electrically connected to the bias RF power supply for controlling the bias RF power supply to discontinuously supply the bias RF power during the plasma etching process.

The present invention is also directed to a method for preparing a stacked capacitor, comprising the steps of: forming a trench in a substrate according to the above-mentioned plasma etching method; forming a plurality of stacked capacitive structures on the substrate, wherein the stacked capacitive structure includes a first conductive layer, a first dielectric layer and a second conductive layer; forming an opening in the stacked capacitive structures in the trench; connecting the first conductive layers in the opening; and connecting the second conductive layers on the surface of the substrate.

The present invention is also directed to a method for preparing a stacked capacitor, comprising the steps of: forming a trench in a substrate according to the above-mentioned plasma etching method; forming at least one stacked capacitive structure on the substrate, wherein the stacked capacitive structure includes a first conductive layer, a first dielectric layer and a second conductive layer; forming a second dielectric layer on the stacked capacitive structure; forming an opening in the second dielectric layer and the stacked capacitive structure in the trench; isolating the second conductive layer in the opening; and forming a third conductive layer on the second dielectric layer and in the opening.

BRIEF DESCRIPTION OF THE DRAWINGS

The objectives of the present invention will become apparent upon reading the following description and upon reference to the accompanying drawings in which.

DETAILED DESCRIPTION

Figure 1:
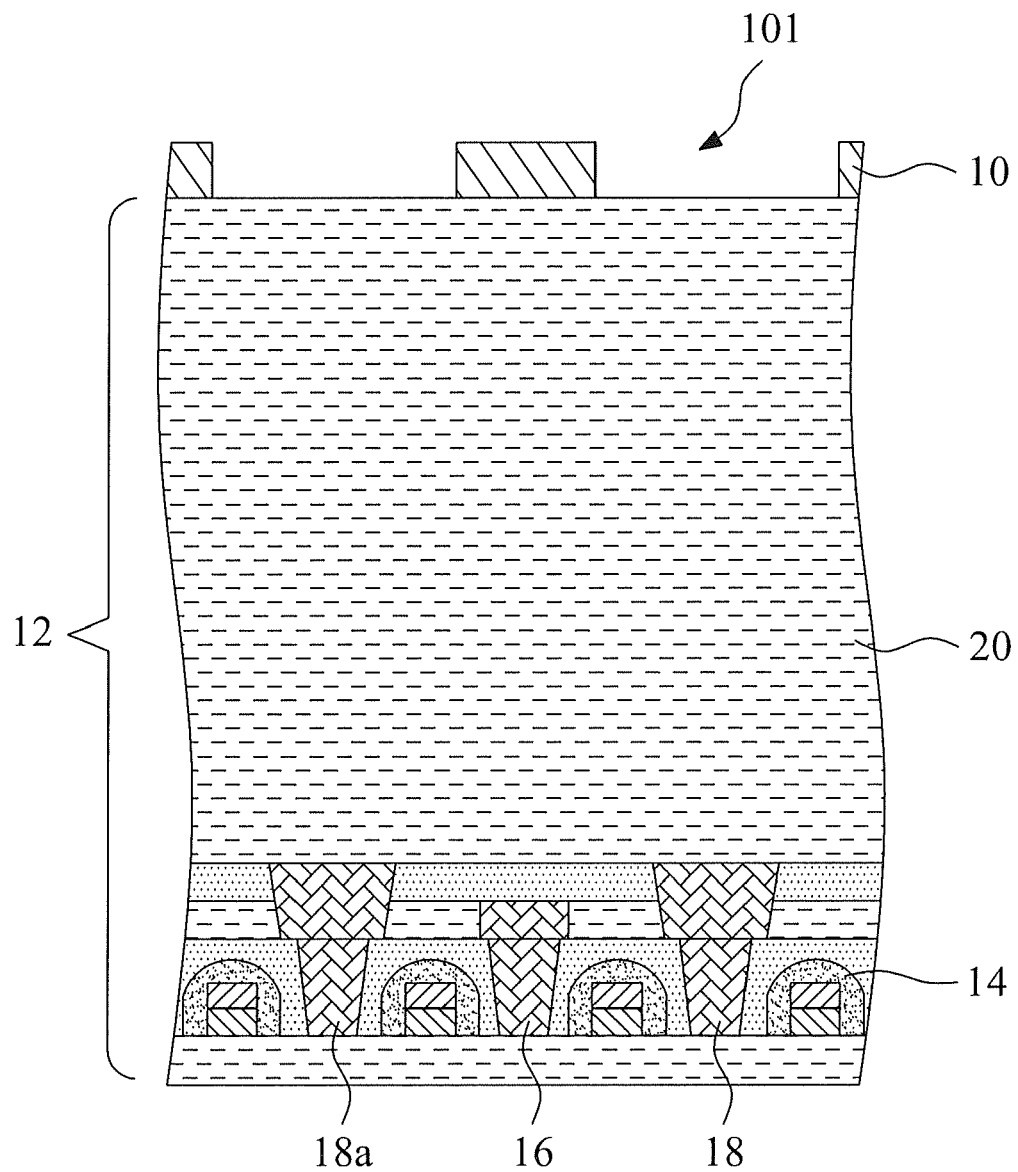
FIG. 1 is a cross-sectional view illustrating the etching step of a conventional method for preparing a stacked capacitor, wherein a carbon hard mask is applied on a substrate.
Figure 2:
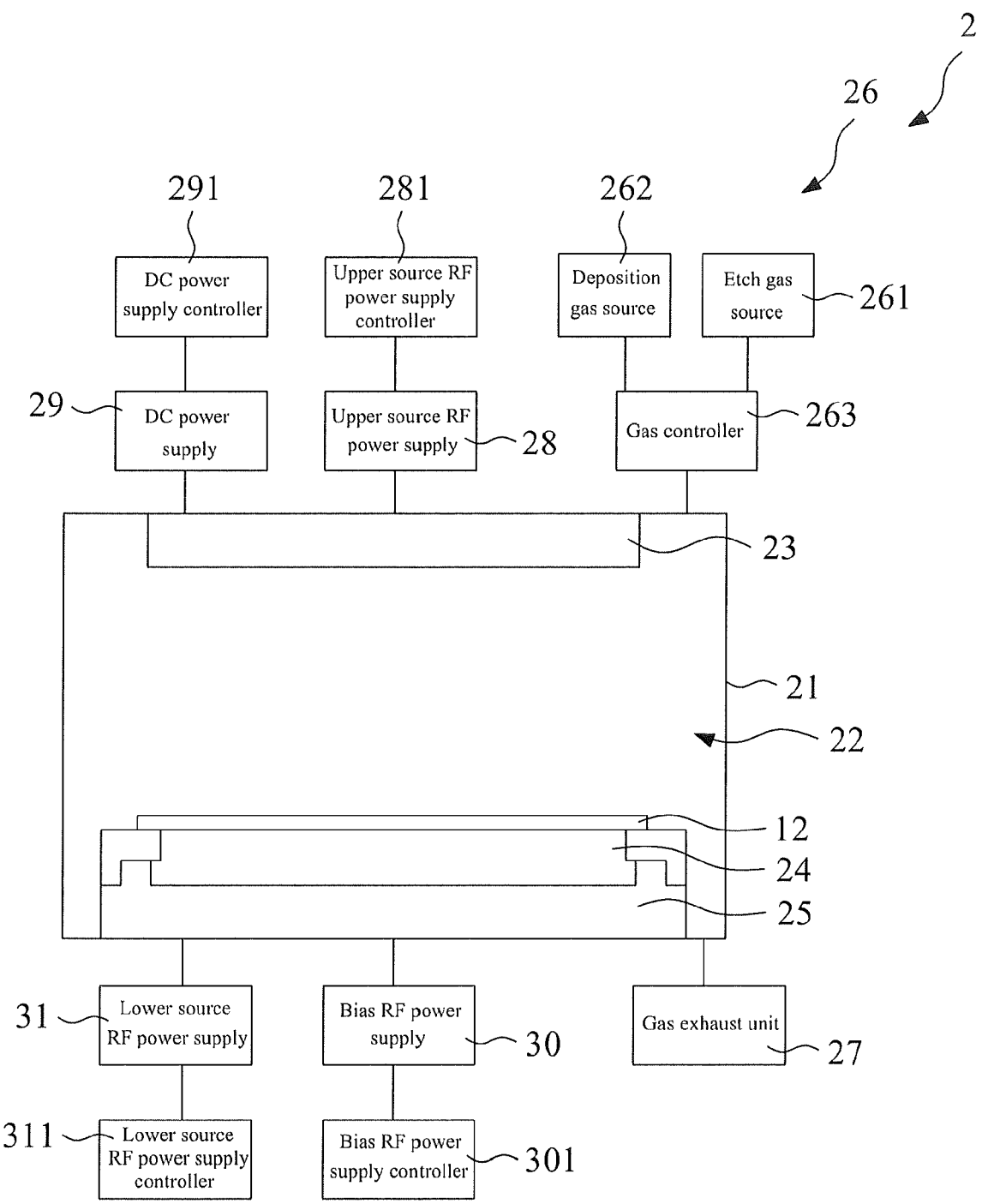
FIG. 2 is a schematic view illustrating a conventional plasma etching apparatus.
Figure 3:
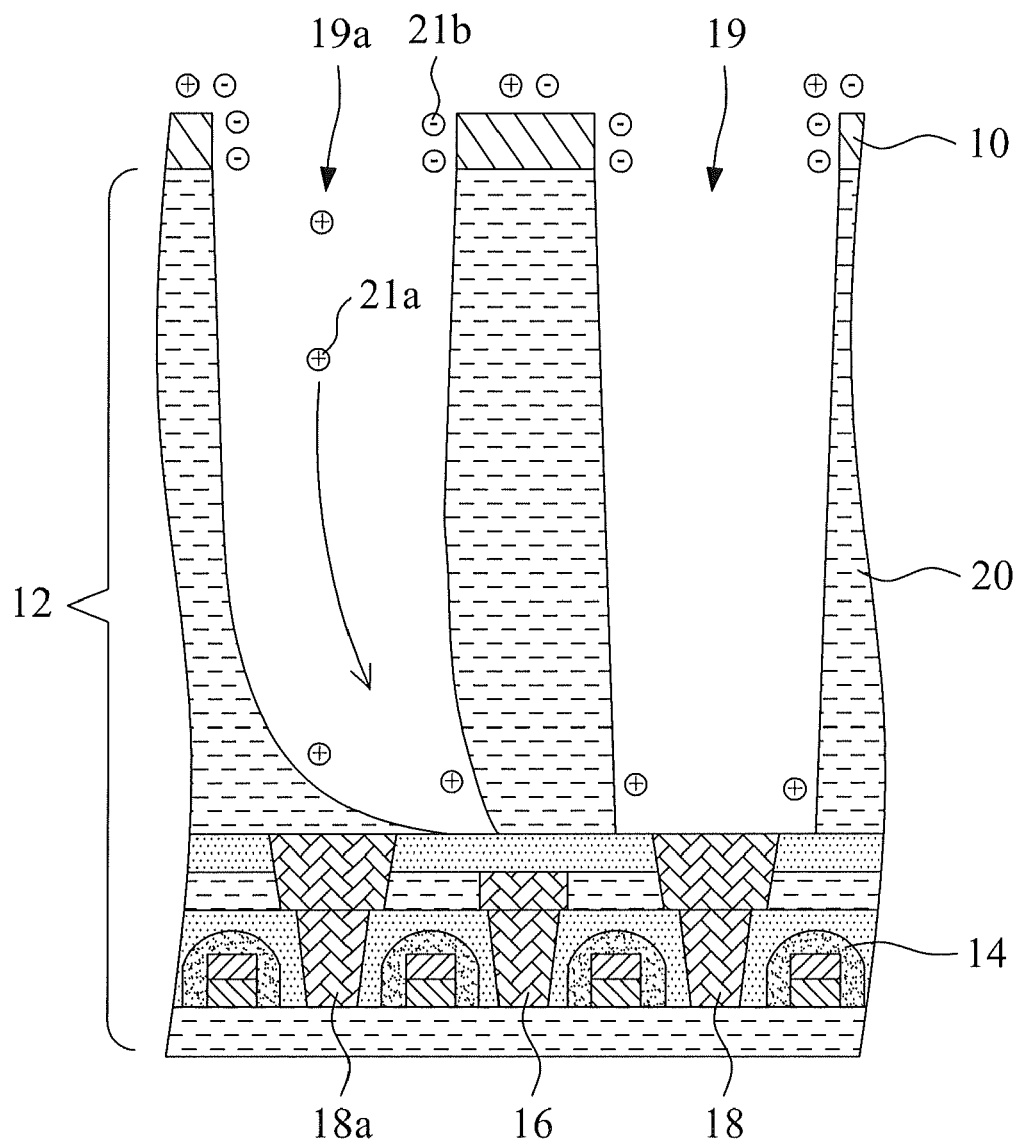
FIG. 3 is a cross-sectional view illustrating the etching step of a conventional method for preparing a stacked capacitor, wherein two trenches are formed in a substrate.
Figure 4:
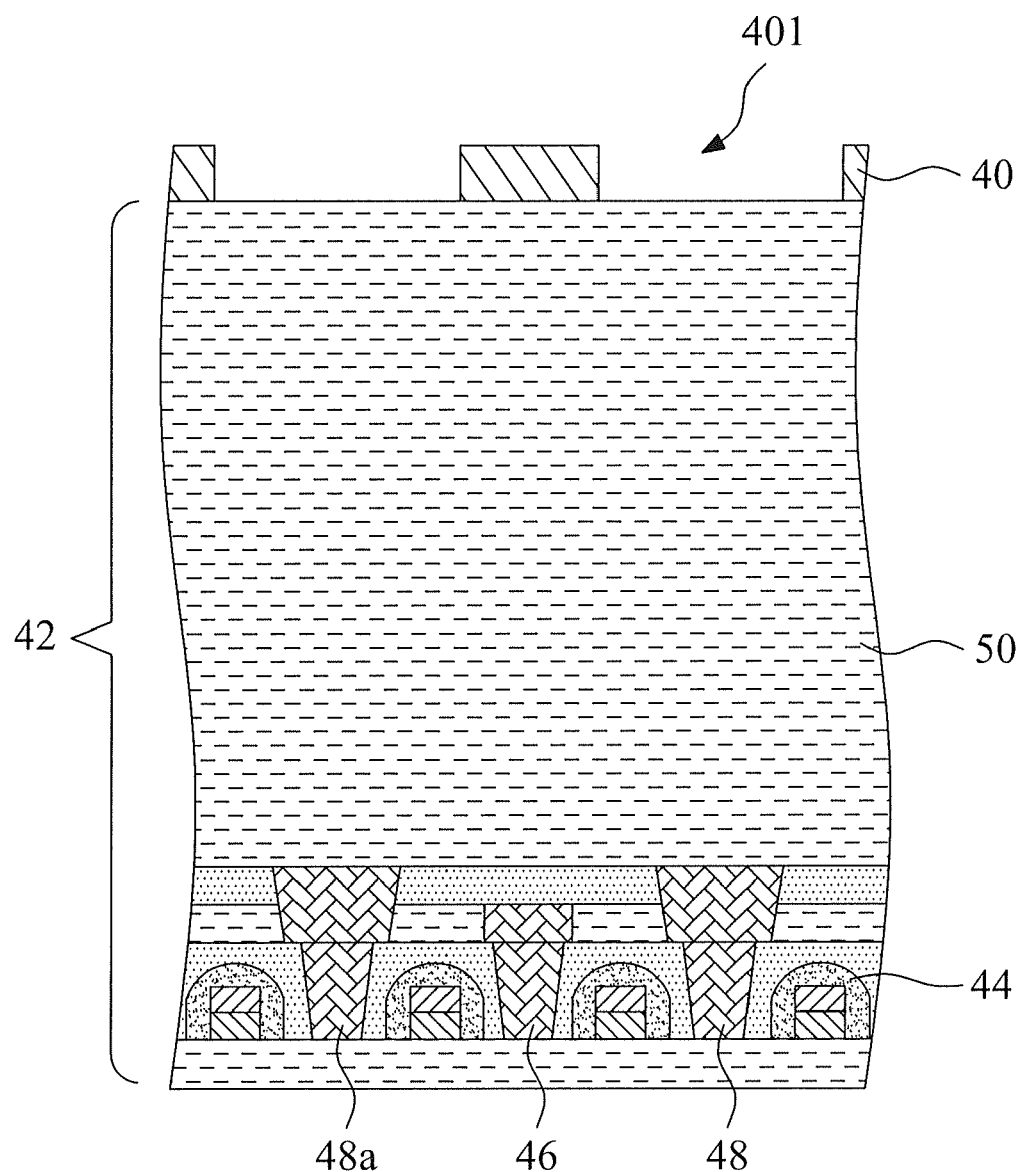
FIG. 4 is a cross-sectional view illustrating the method for preparing a stacked capacitor according to one embodiment of the present invention, wherein a carbon hard mask is applied on a substrate.

In FIGS. 4 to 15, the method for preparing a stacked capacitor according to one embodiment of the present invention is illustrated. As shown in FIG. 4, a substrate 42 is provided. The substrate 42 includes four gate structures 44, a bit-line contact plug 46, two capacitor contact plugs 48, 48a and a dielectric layer 50. A carbon hard mask 40 is applied on the substrate 42. The carbon hard mask 40 has a pattern 401 to expose part of the substrate 42.

Figure 5:
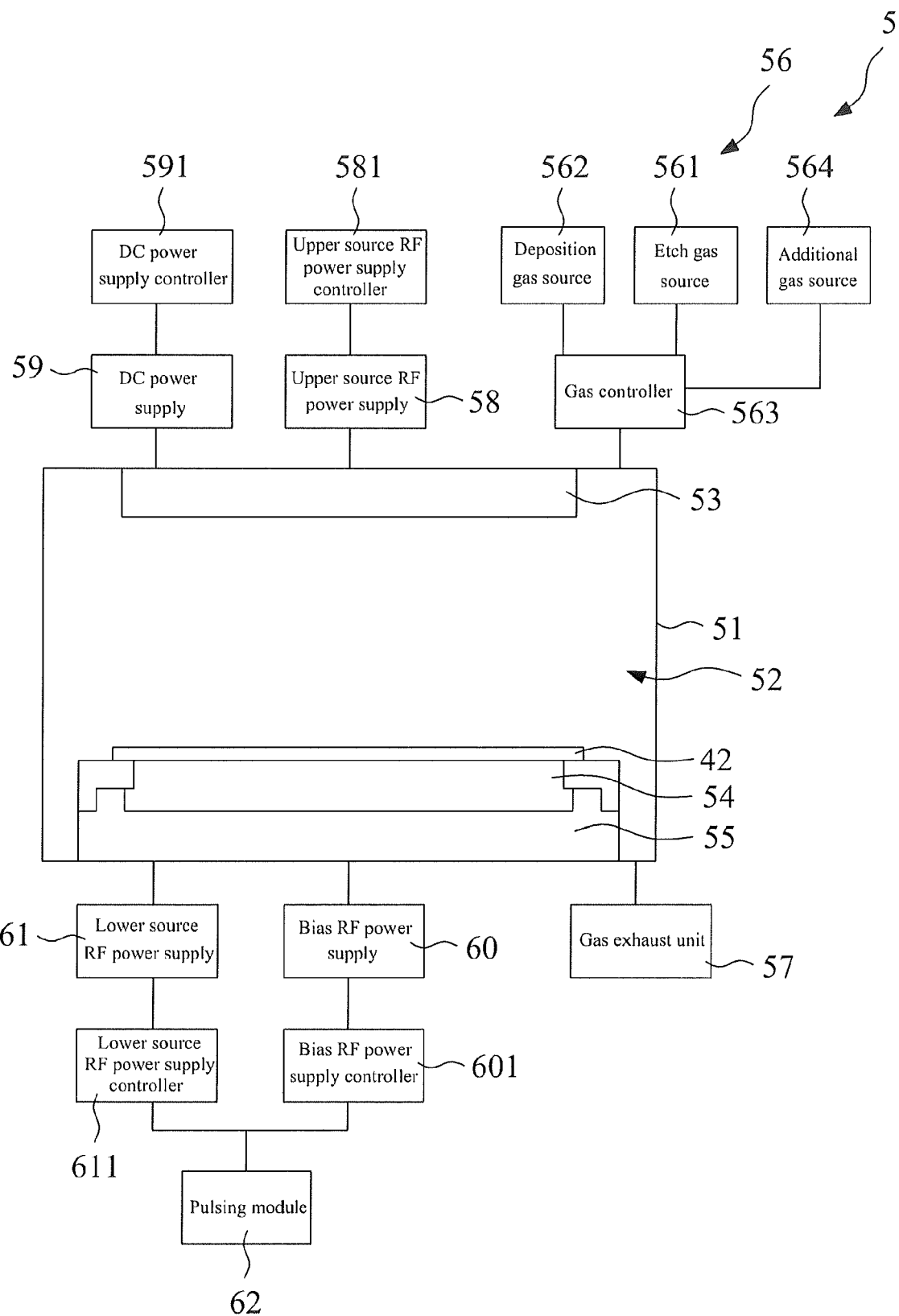
FIG. 5 is a schematic view illustrating a plasma etching apparatus according to one embodiment of the present invention.

As shown in FIG. 5, the substrate 42 with the carbon hard mask 40 is placed in a plasma etching apparatus 5. The plasma etching apparatus 5 comprises a container 51, an upper electrode plate 53, a lower electrode plate 55, a gas source 56, a gas exhaust unit 57, an upper source RF power supply 58, an upper source RF power supply controller 581, a DC power supply 59, a DC power supply controller 591, a bias RF power supply 60, a bias RF power supply controller 601, a lower source RF power supply 61, a lower source RF power supply controller 611 and a pulsing module 62.

The container 51 defines a processing chamber 52 and is electrically grounded. The upper electrode plate 53 disposed in the processing chamber 52. The lower electrode plate 55 is disposed in the processing chamber 52 and includes a chuck 54 for holding the substrate 42. The gas source 56 is connected to the processing chamber 52 for introducing a processing gas into the processing chamber 52. In this embodiment, the gas source 56 comprises an etch gas source 561, a deposition gas source 562 and a gas controller 563. The etch gas source 561 supplies an etch gas to the processing chamber 52 and the deposition gas source 562 to supplies a deposition gas to the processing chamber 52 through the gas controller 563. The processing gas comprises the etch gas and the deposition gas. The gas exhaust unit 57 is used for removing the gas from the processing chamber 52 so as to control the pressure in the processing chamber 52.

The upper source RF power supply 58 is controlled by the upper source RF power supply controller 581, and is electrically connected to the upper electrode plate 53 for continuously supplying an upper source RF power to the upper electrode plate 53 during a plasma etching process. The DC power supply 59 is controlled by the DC power supply controller 591, and is electrically connected to the upper electrode plate 53 for continuously supplying a DC power to the upper electrode plate 53 during the plasma etching process.

The bias RF power supply 60 is controlled by the bias RF power supply controller 601, and is electrically connected to the lower electrode plate 55 for supplying a bias RF power to the lower electrode plate 55 so as to generate a plasma in the processing chamber 52 to etch the substrate 42. The pulsing module 62 is electrically connected to the bias RF power supply controller 601, so that the bias RF power is supplied discontinuously during the plasma etching process. That is, the bias RF power is a pulse power and is switched alternately on/off in a very short time, wherein the bias RF power is supplied during the on state and the bias RF power is cut off during the off state. In this embodiment, the duration of the on state ($T_{on}$) is between 1 and 100 microseconds, and the duration of the off state ($T_{off}$) is between 1 and 100 microseconds. Preferably, the duration of the on state ($T_{on}$) is equal to the duration of the off state ($T_{off}$), and is about 10 microseconds.

The lower source RF power supply 61 is controlled by the lower source RF power supply controller 611, and is electrically connected to the lower electrode plate 55 for supplying a lower source RF power to the lower electrode plate 55. The lower source RF power may be continuously supplied to the lower electrode plate 55. Alternatively, the pulsing module 62 may be electrically connected to the lower source RF power supply 61, so that the lower source RF power is discontinuously supplied to the lower electrode plate 55 during the plasma etching process, and the lower source RF power is supplied synchronously with the bias RF power.

In this embodiment, the plasma etching apparatus 5 further comprises an additional gas source 564 connected to the processing chamber 52 through the gas controller 563. When the bias RF power is switched to the off state, the processing gas is immediately removed from the processing chamber 52 by the gas exhaust unit 57, and an additional gas is introduced into the processing chamber 52 by the additional gas source 564. The additional gas can provide the secondary electrons and acts as a purge gas to reduce the processing gas in the processing chamber 52. The additional gas may be Ar, He, Xe, $N_2$ or $H_2$. Therefore, the gas exhaust unit 57 includes a high performance pumping system.

In the present invention, when the bias RF power is switched to the off state, the sheath disappears. Therefore, a large amount of secondary electrons pass through the bulk plasma and reach the bottom of the trenches 49, 49a to neutralize the positive ions during the duration of the off state ($T_{off}$).

Figure 6:
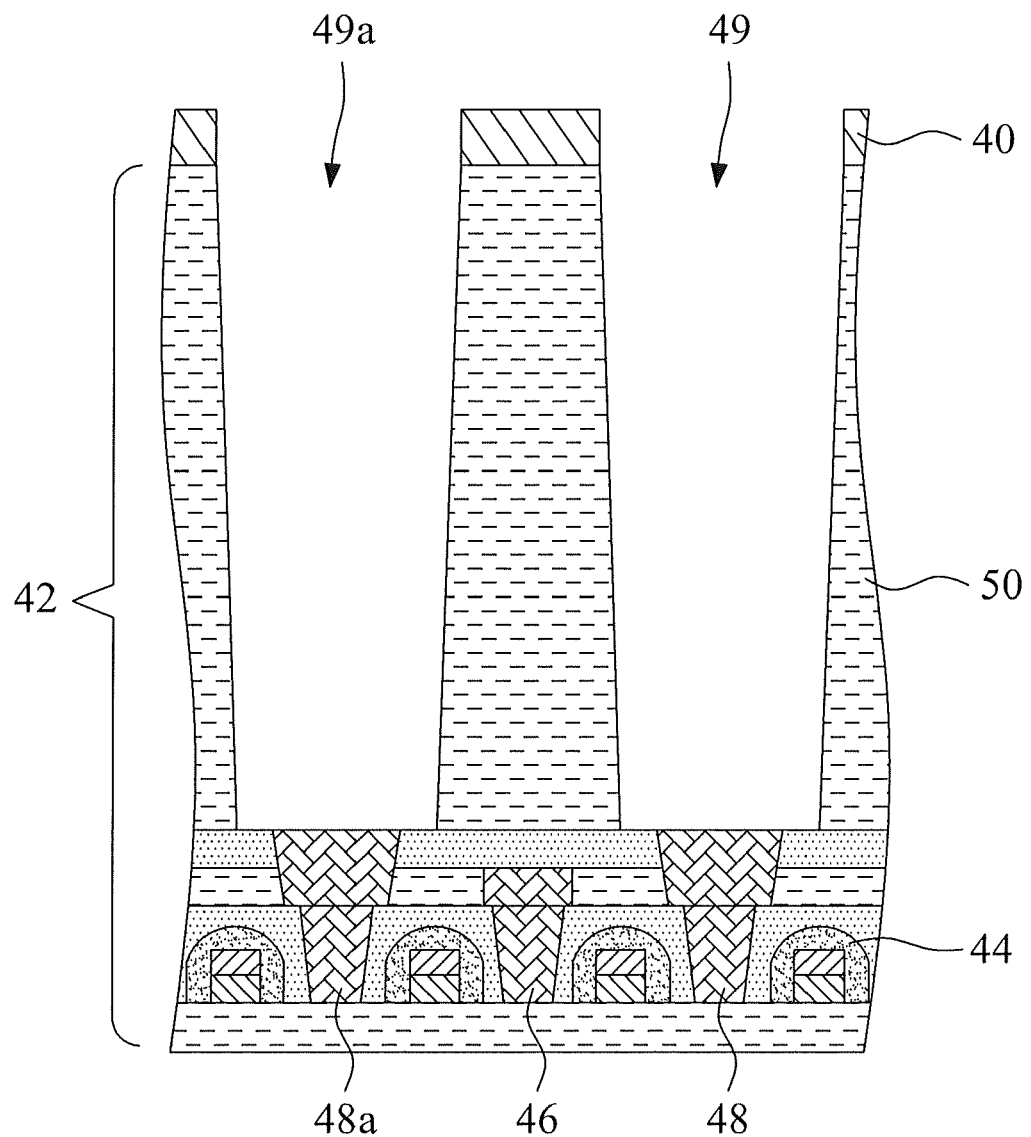
FIG. 6 is a cross-sectional view illustrating the method for preparing a stacked capacitor according to one embodiment of the present invention, wherein two trenches are formed in a substrate.

As shown in FIG. 6, in the etching process, the dielectric layer 50 of the substrate 42 is etched to form two high-aspect-ratio structures, such as trenches 49, 49a. The trenches 49, 49a expose the capacitor contact plugs 48, 48a and are straight so they are considered as qualified trenches. It should be understood that the above-mentioned plasma etching method and plasma etching apparatus are used for forming high-aspect-ratio trenches 49, 49a in a semiconductor substrate 42, however, they may be used for forming other high-aspect-ratio structures, such as holes, in a substrate.

Figure 7:
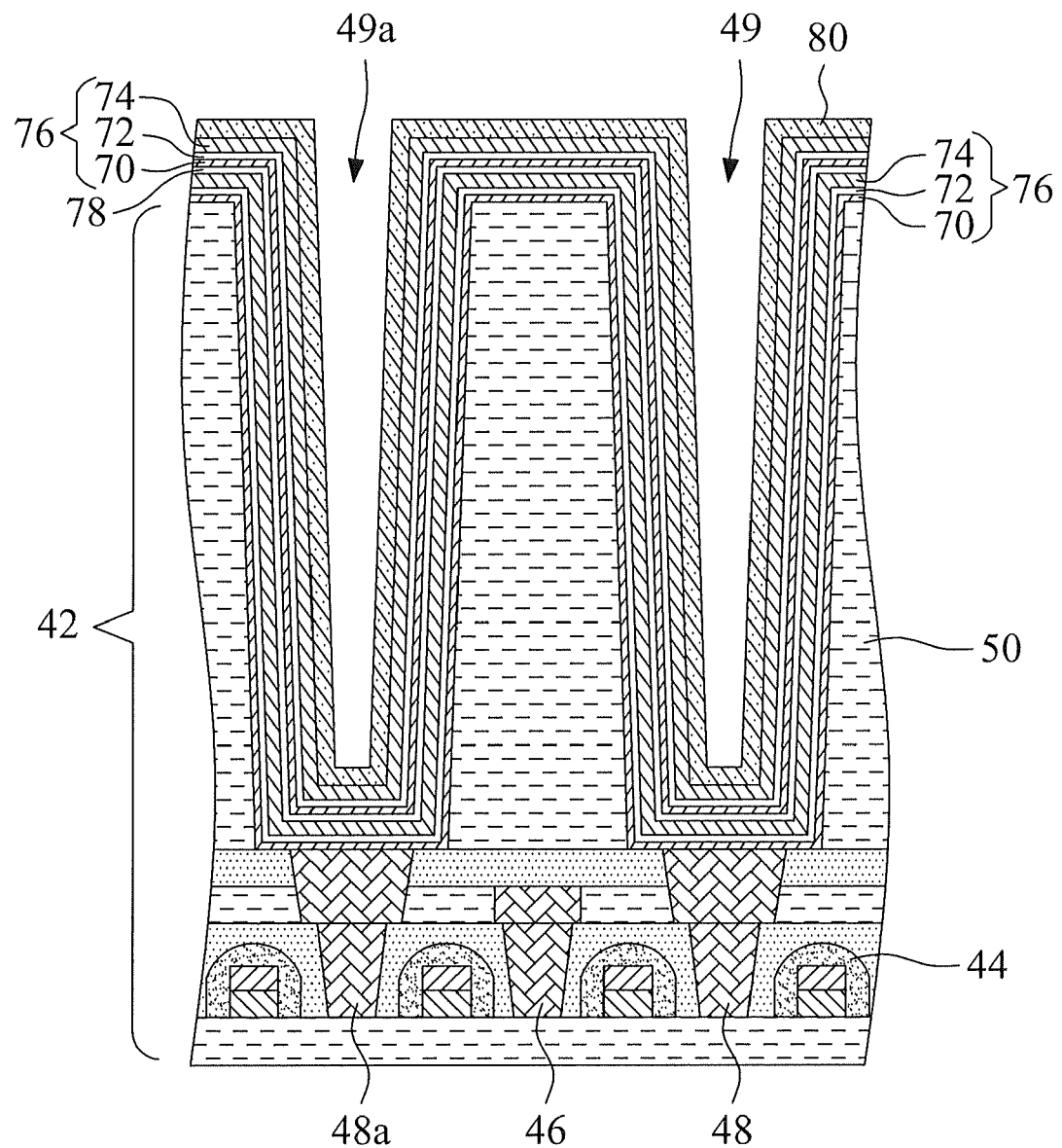
FIG. 7 is a cross-sectional view illustrating the method for preparing a stacked capacitor according to one embodiment of the present invention, wherein stacked capacitive structures are formed in the trenches.

As shown in FIG. 7, the carbon hard mask 40 is removed. Next, a deposition process is performed to form two stacked capacitive structures 76 on the substrate 42 and a dielectric layer 78 sandwiched between the two capacitive structures 76, wherein the capacitive structure 76 comprises a conductive layer 70, a dielectric layer 72 and a conductive layer 74. A dielectric layer 80 is then deposited on the surface of the capacitive structure 76. The conductive layer 70 is a titanium nitride layer formed by atomic layer deposition, both the dielectric layer 72 and the dielectric layer 78 are silicon nitride layers formed by atomic layer deposition or chemical vapor deposition, and the conductive layer 74 is a polysilicon layer formed by epitaxy process or chemical vapor deposition.

In addition, after the dielectric layer 72 and the dielectric layer 78 consisting of silicon nitride are deposited, hydrochloric acid is used as an oxidizing agent to oxidize the surface of the dielectric layer 72 and the dielectric layer 78 into silicon-oxy-nitride ($SiNO_x$) to form a double-layer structure consisting of silicon nitride/silicon-oxy-nitride. The dielectric layer 80 can be a silicon oxide layer formed by tetra-ethyl-ortho-silicate deposition or silicon nitride/silicon oxide (a double-layer structure).

Figure 8:
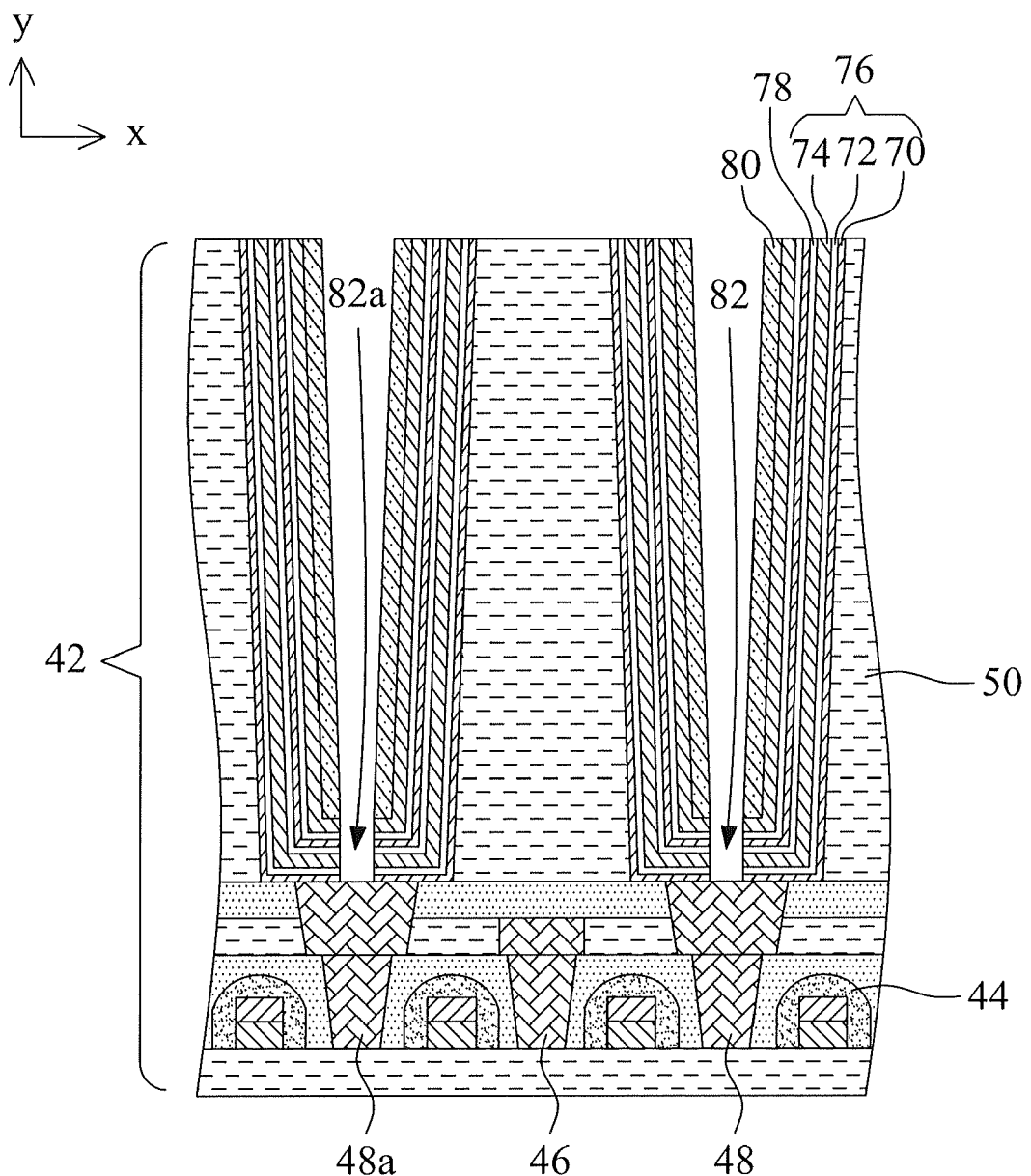
FIG. 8 is a cross-sectional view illustrating the method for preparing a stacked capacitor according to one embodiment of the present invention, wherein the openings are formed in the capacitive structure.
Figure 9:
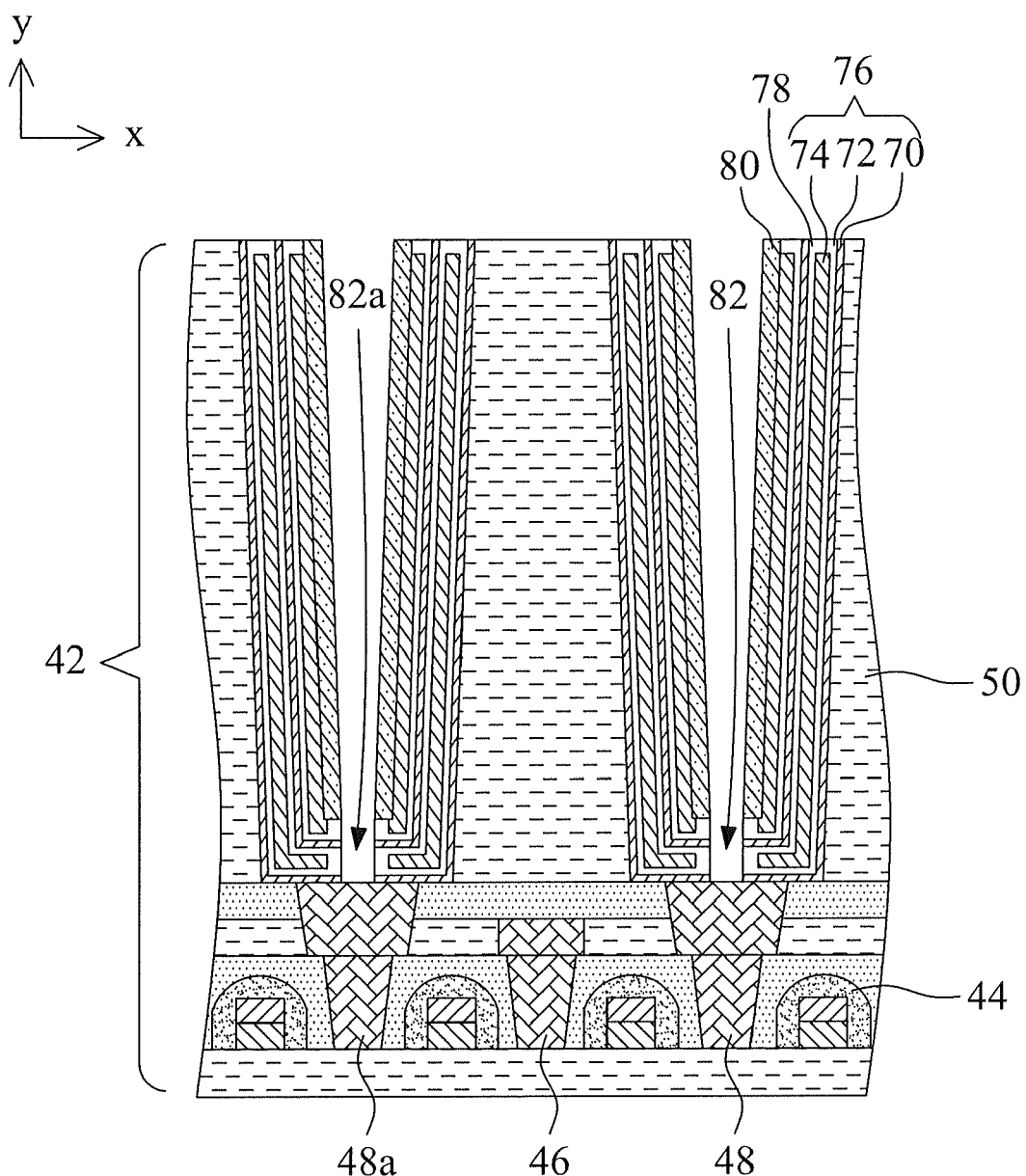
FIG. 9 is a cross-sectional view illustrating the method for preparing a stacked capacitor according to one embodiment of the present invention, wherein the conductive layer is isolated.

Referring to FIG. 8, an etching process is performed to remove a portion of the dielectric layer 80, the capacitive structure 76 and the dielectric layer 78 at the lower of the trenches 49, 49a to form the openings 82, 82a down to the surface of the capacitor contact plugs 48, 48a, i.e., the openings 82, 82a are formed in the capacitive structure 76 inside the trenches 49, 49a. The polysilicon of the conductive layer 74 is transformed into insulating silicon nitride in a nitrogen-containing atmosphere to isolate the conductive layer 74 exposed to the openings 82, 82a. Particularly, a portion of polysilicon of the conductive layer 74 exposed to the openings 82, 82a and positioned on the surface of the substrate 42 will be transformed into silicon nitride composing the dielectric layer 72 and the dielectric layer 78, as shown in FIG. 9.

The etching process can be a dry etching process using carbon tetrafluoride and oxygen as etching gases, wherein the pressure in the reaction chamber is preferably about 60 mTorr, the power is about 100 W, and the frequency is 13.56 MHz. The thickness of the dielectric layer 80 in y direction is greater than that in x direction, and the dry etching can therefore remove the dielectric layer 80, the capacitive structure 76 and the dielectric layer 78 down to the surface of the capacitor contact plugs 48, 48a substantially without removing the dielectric layer 80 and the capacitive structure 76 from sidewalls of the trenches 49, 49a. That is, the dry etching process forms the openings 82, 82a in a self-aligned manner to expose the capacitor contact plugs 48, 48a.

Figure 10:
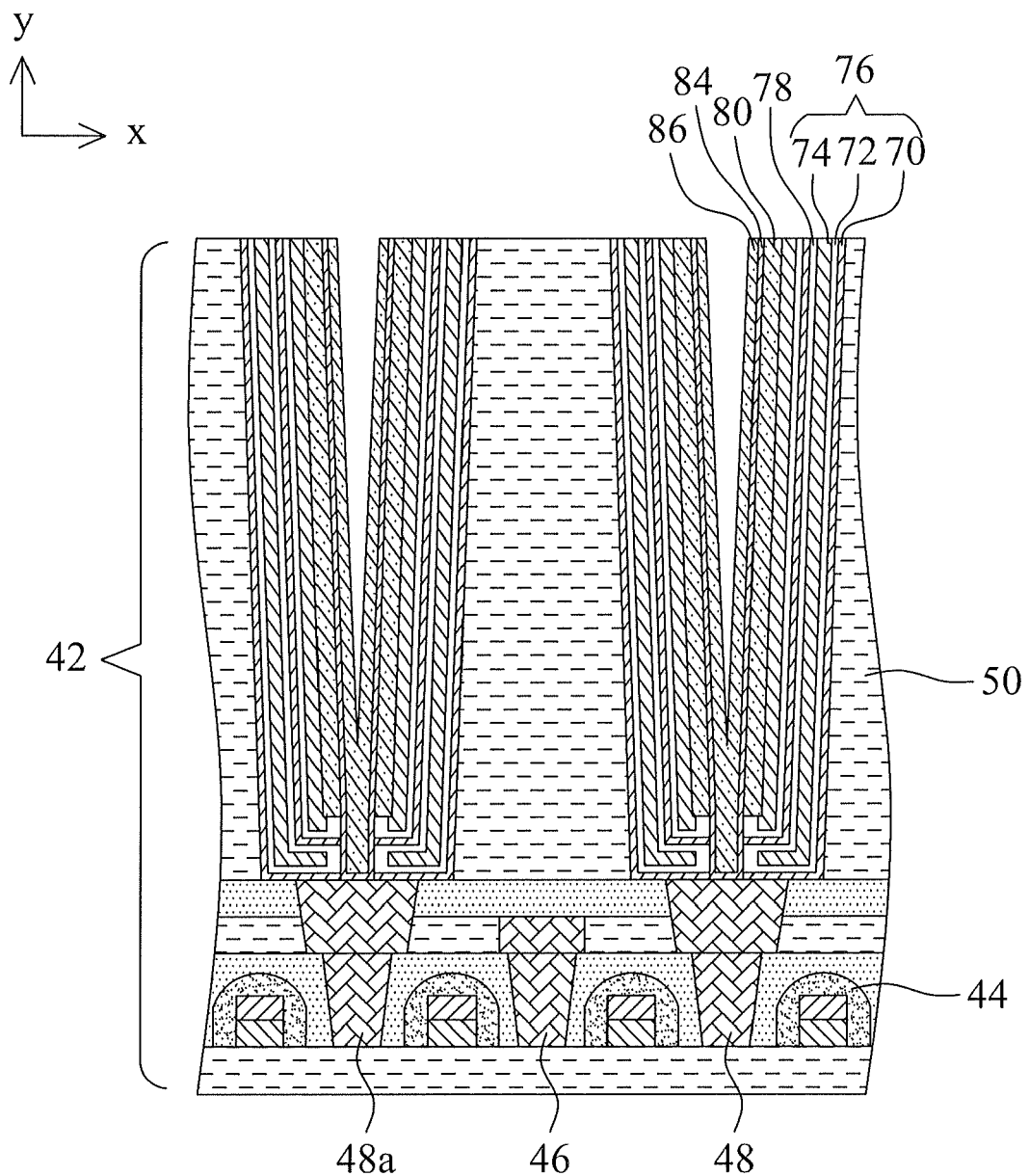
FIG. 10 is a cross-sectional view illustrating the method for preparing a stacked capacitor according to one embodiment of the present invention, wherein a conductive layer and a dielectric layer are deposited in the opening.

Referring to FIG. 10, a conductive layer 84 is deposited in the openings 82, 82a and a dielectric layer 86 is subsequently deposited on the conductive layer 84. The conductive layer 84 in the openings 82, 82a is electrically connected to the conductive layer 70 and the capacitor contact plugs 48, 48a, and the dielectric layer 86 fills the openings 82, 82a. The conductive layer 84 is a titanium nitride layer formed by atomic layer deposition, and the dielectric layer 86 is made of tetra-ethyl-ortho-silicate. A chemical-mechanical polishing process is then performed to planarize the surface of the substrate 42.

Figure 11:
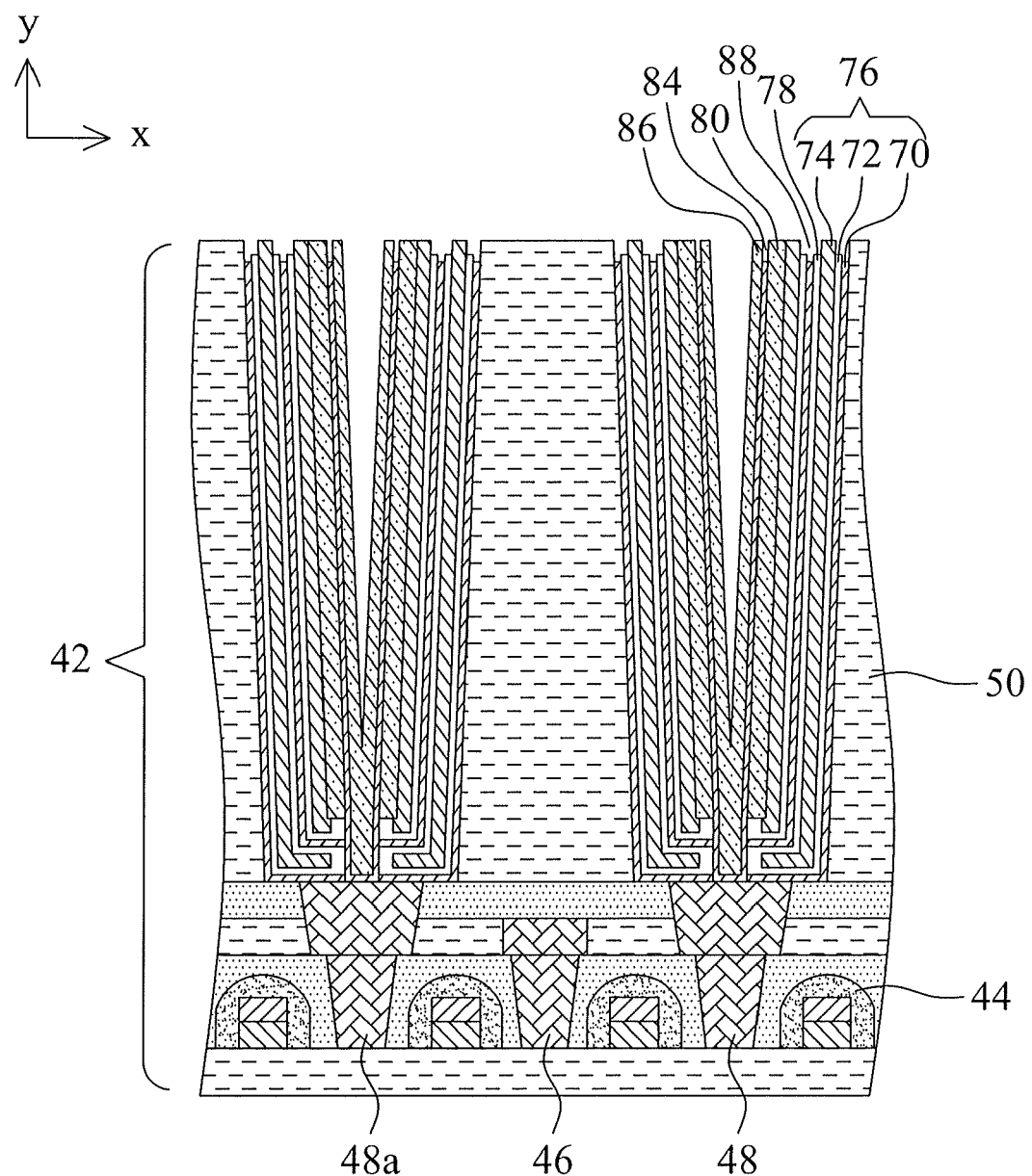
FIG. 11 is a cross-sectional view illustrating the method for preparing a stacked capacitor according to one embodiment of the present invention, wherein a wet etching process is performed.

As shown in FIG. 11, a wet etching process is performed to remove a portion of the dielectric layer 72 and the dielectric layer 78 from the surface of the substrate 42, wherein the wet etching process uses phosphoric acid at 160° C. as etching solution to remove the silicon nitride composing the dielectric layer 72 and the dielectric layer 78. Another wet etching process is then performed to remove a portion of the conductive layer 70 and the conductive layer 84 consisting of titanium nitride from the surface of the substrate 42 to form a gap 88 between the conductive layer 74 consisting of polysilicon, wherein the etching solution used to etch the titanium nitride preferably is comprised of 22% of $(NH_4)_2Ce(NO_3)_6$ and 8% of acetic acid, and the reaction temperature is preferably about 20° C.

Figure 12:
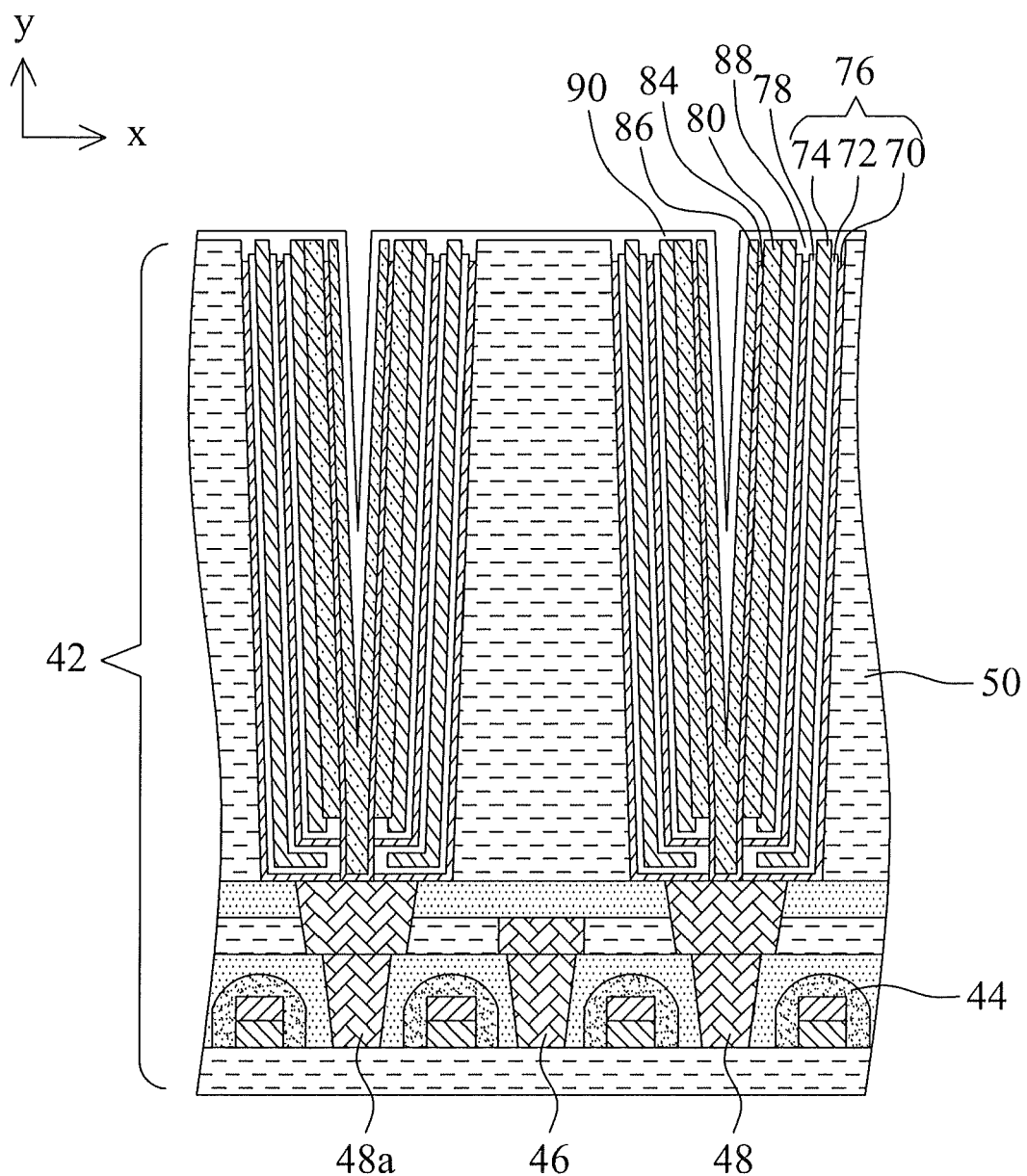
FIG. 12 is a cross-sectional view illustrating the method for preparing a stacked capacitor according to one embodiment of the present invention, wherein a dielectric layer is deposited on the surface of the substrate and fills the gap.
Figure 13:
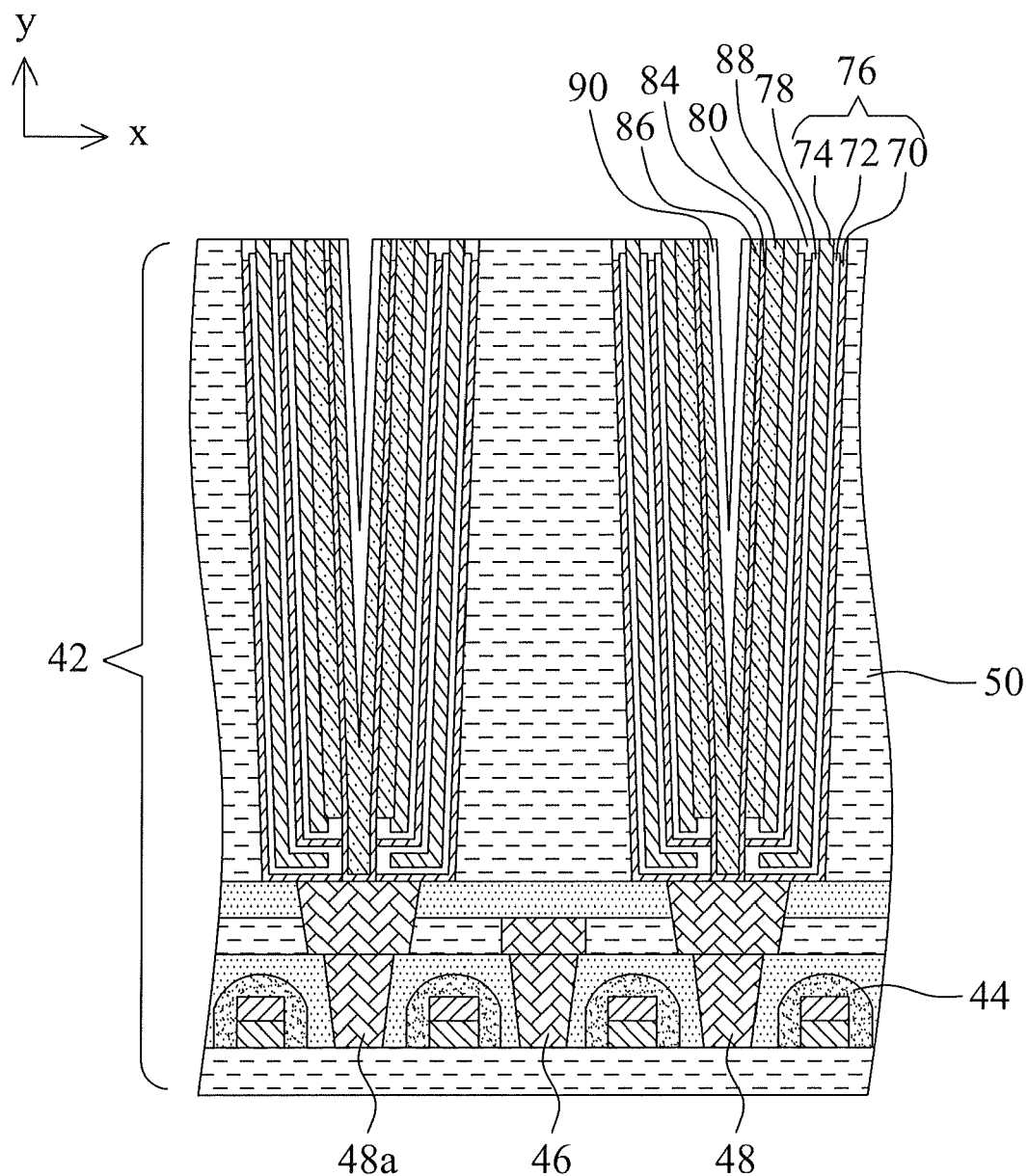
FIG. 13 is a cross-sectional view illustrating the method for preparing a stacked capacitor according to one embodiment of the present invention, wherein the dielectric layer is removed from the surface of the substrate.

As shown in FIG. 12, a dielectric layer 90 is deposited on the surface of the substrate 42 and fills the gap 88, wherein the dielectric layer 90 is a silicon nitride layer formed by atomic layer deposition. A wet etching process or a planarization process is performed to remove the dielectric to layer 90 from the surface of the substrate 42, while the dielectric layer 90 in the gap 88 remains, as shown in FIG. 13. Removing the dielectric layer 90 from the surface of the substrate 42 exposes the conductive layer 74 consisting of polysilicon. The conductive layer 70 and the conductive layer 84 consisting of titanium nitride are not exposed since the dielectric is layer 90 remaining in the gap 88 covers the conductive layer 70 and the conductive layer 84.

Figure 14:
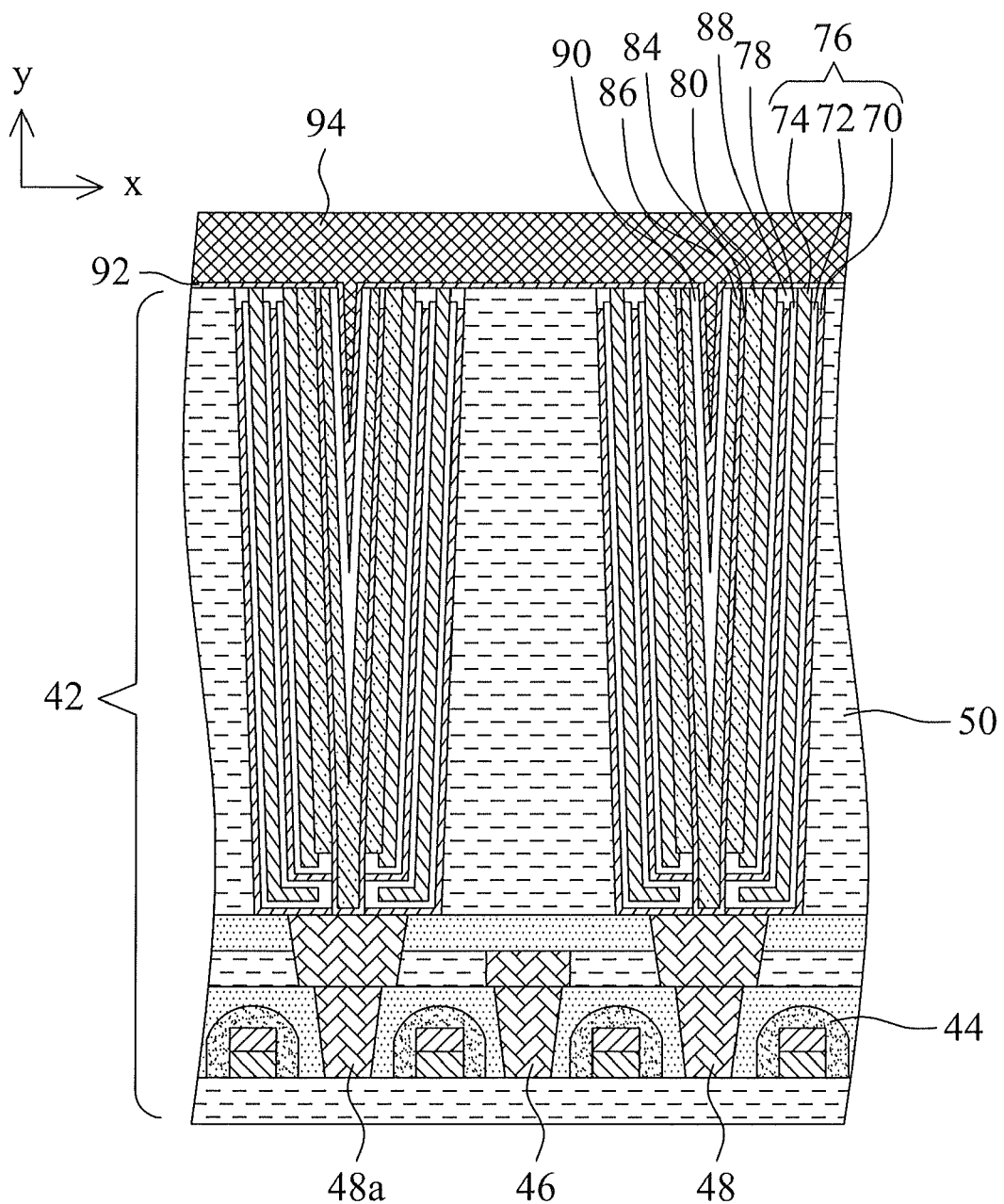
FIG. 14 is a cross-sectional view illustrating the method for preparing a stacked capacitor according to one embodiment of the present invention, wherein a conductive layer is deposited on the surface of the substrate.
Figure 15:
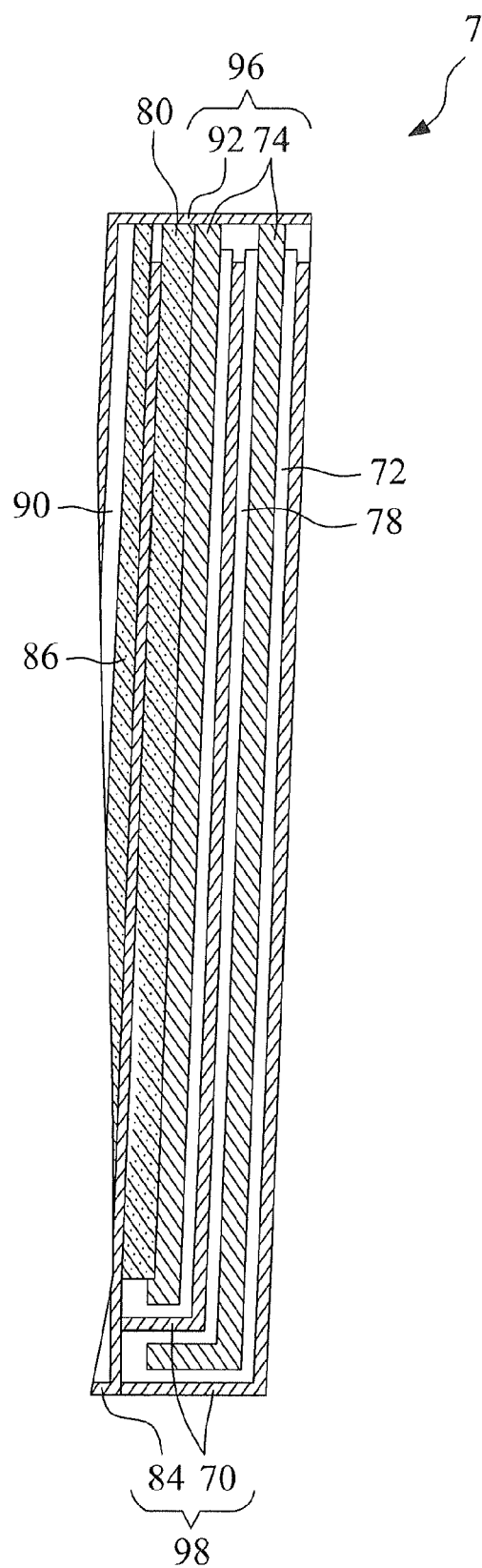
FIG. 15 is a cross-sectional view illustrating a stacked capacitor according to one embodiment of the present invention.

As shown in FIG. 14, a conductive layer 92 is deposited on the surface of the substrate 42 to electrically connect to the conductive layer 74, wherein the conductive layer 90 is made of titanium nitride. A dielectric layer 94 is then deposited on the conductive layer 90 to complete the stacked capacitor 7, as shown in FIG. 15. The stacked capacitor 7 comprises an upper interdigital electrode 96, a lower interdigital electrode 98, and a dielectric material sandwiched between the upper interdigital electrode 96 and the lower interdigital electrode 98. The upper interdigital electrode 96 consists of the conductive layer 92 and the conductive layer 74, the lower interdigital electrode 98 consists of the conductive layer 84 and the conductive layer 70, and the dielectric material consists of the dielectric layer 72, the dielectric layer 78, the dielectric layer 80 and the dielectric layer 86. Preferably, the dielectric material sandwiched between the upper interdigital electrode 96 and the lower interdigital electrode 98 has a dielectric constant greater than or equal to 3.9. For example, the dielectric material can be silicon nitride, silicon oxide, aluminum oxide or titanium oxide.

Fingers of the upper interdigital electrode 96 can be made of polysilicon (the conductive layer 74) or aluminum, and fingers of the lower interdigital electrode 98 are made of titanium nitride (conductive layer 70) or titanium, i.e., the finger of the upper interdigital electrode 96 and the finger of the lower interdigital electrode 98 can be made of different conductive materials. Particularly, the body (the conductive layer 92) of the upper interdigital electrode 96 is made of titanium nitride or titanium, and the finger (the conductive layer 74) is made of polysilicon or to aluminum, i.e., the body and the finger of the upper interdigital electrode 96 can be made of different conductive materials.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A plasma etching method for preparing high-aspect-ratio structures, comprising the steps of:
   forming a mask on a substrate, wherein the mask has a pattern;
   placing the substrate with the mask into a plasma etching apparatus, wherein the plasma etching apparatus comprises a processing chamber, an upper electrode plate and a lower electrode plate, the upper electrode plate and the lower electrode plate are disposed in the processing chamber, and the lower electrode plate includes a chuck for holding the substrate;
   introducing a processing gas into the processing chamber;
   continuously supplying an upper source RF power and a DC power to the upper electrode plate during the plasma etching process;
   supplying a bias RF power to the lower electrode plate so as to generate a plasma in the processing chamber to etch the substrate according to the pattern of the mask, wherein the bias RF power is supplied discontinuously during the plasma etching process, wherein the bias RF power is a pulse power and is alternately switched on and off, and wherein the bias RF power is supplied during the on state and the bias RF power is cut off during the off state; and
   the processing gas is removed from the processing chamber and an additional gas is introduced into the processing chamber when the bias RF power is switched to the off state.

2. The plasma etching method of claim 1, wherein the substrate has a dielectric layer and the mask is on the dielectric layer.

3. The plasma etching method of claim 1, wherein the mask is a carbon hard mask.

4. The plasma etching method of claim 1, wherein the processing gas comprises an etch gas and a deposition gas.

5. The plasma etching method of claim 1, further comprising a step of discontinuously supplying a lower source RF power to the lower electrode plate during the plasma etching process, and the lower source RF power is supplied synchronously with the bias RF power.

6. The plasma etching method of claim 1, wherein the duration of the on state is between 1 and 100 microseconds, and the duration of the off state is between 1 and 100 microseconds.

7. The plasma etching method of claim 1, wherein the additional gas is selected from the group consisting of Ar, He, Xe, $N_2$, $H_2$ and the combination thereof.

8. A method for preparing a stacked capacitor, comprising the steps of:
   forming a trench in a substrate according to the plasma etching method of claim 1;
   forming at least one stacked capacitive structure on the substrate, wherein the stacked capacitive structure includes a first conductive layer, a first dielectric layer and a second conductive layer;
   forming a second dielectric layer on the stacked capacitive structure;
   forming an opening in the second dielectric layer and the stacked capacitive structure in the trench;

isolating the second conductive layer in the opening; and forming a third conductive layer on the second dielectric layer and in the opening.

9. The method for preparing a stacked capacitor of claim 8, wherein the first conductive layer is a titanium nitride layer formed by atomic layer deposition, the first dielectric layer is a silicon nitride layer formed by atomic layer deposition or chemical vapor deposition, and the second conductive layer is a polysilicon layer formed by an epitaxy process or chemical vapor deposition.

10. The method for preparing a stacked capacitor of claim 9, wherein the step of isolating the second conductive layer in the opening is performed in a nitrogen-containing atmosphere to transform polysilicon into silicon nitride.

11. The method for preparing a stacked capacitor of claim 8, wherein the step of forming an opening in the second dielectric layer and the stacked capacitive structure in the trench is a dry etching process using carbon tetrafluoride and oxygen as etching gases.

* * * * *